US005537246A

United States Patent [19]
Sulzbach et al.

[11] Patent Number: 5,537,246
[45] Date of Patent: Jul. 16, 1996

[54] THORIUM-FREE COATING FOR GERMANIUM IR WINDOW

[75] Inventors: Frank C. Sulzbach, Dallas; Valeria J. Epling, Richardson, both of Tex.

[73] Assignee: Texas Instruments Incorporated, Dallas, Tex.

[21] Appl. No.: 421,136

[22] Filed: Apr. 13, 1995

Related U.S. Application Data

[60] Continuation of Ser. No. 259,214, Jun. 13, 1994, abandoned, which is a division of Ser. No. 966,920, Oct. 27, 1992, Pat. No. 5,349,467.

[51] Int. Cl.$^6$ .............................. G02B 1/11; G02B 5/28; B05D 5/06
[52] U.S. Cl. ............................ 359/359; 359/581; 359/582
[58] Field of Search ........................................ 359/359, 360, 359/581, 582, 601; 427/164, 165

[56] References Cited

U.S. PATENT DOCUMENTS

| | | | |
|---|---|---|---|
| 3,247,392 | 4/1966 | Thelen | 359/359 |
| 4,556,599 | 12/1985 | Sato et al. | 359/359 |
| 4,783,373 | 11/1988 | Baumeister et al. | 359/359 |
| 4,895,767 | 1/1990 | Mori et al. | 359/601 |
| 4,997,241 | 3/1991 | Muratomi | 359/359 |
| 5,193,025 | 3/1993 | Carlson et al. | 359/359 |
| 5,349,467 | 9/1994 | Sulzbach et al. | 359/359 |

OTHER PUBLICATIONS

Cox et al, "Infrared Filters of Antireflected Si, Ge, InAs, and InSb," *Journal of the Optical Society of America*, vol. 51, No. 7, Jul., 1961, pp. 714 to 718.

*Primary Examiner*—Martin Lerner
*Attorney, Agent, or Firm*—René E. Grossman; Richard L. Donaldson

[57] ABSTRACT

Durable thorium fluoride, low reflectance, high transmittance coatings for germanium (zinc sulfide, zinc selenide, gallium arsenide) exterior window surfaces are replaced using magnesium fluoride, a material previously not considered applicable to the 8 to 12 μm wavelength range. This is enabled by the use of argon ion bombardment of the growing film. This method reduces the intrinsic stress of deposited films and permits growth of magnesium fluoride films of sufficient thickness to be used on the exterior surface of IR windows.

21 Claims, 1 Drawing Sheet

THORIUM-FREE COATING FOR GERMANIUM IR WINDOW

This application is a continuation, of application Ser. No. 08/259,214, filed on Jun. 13, 1994, entitled THORIUM-FREE COATING FOR GERMANIUM IR WINDOW, now abandoned which is a division of Ser. No. 07/966,920, filed Oct. 27, 1992 now U.S. Pat. No. 5,349,467, issued Sep. 20, 1994.

BACKGROUND OF THE INVENTION

1. Field of the Invention

This invention relates to coatings, primarily for use in connection with the exterior surfaces of optical windows used in connection with transmission of infrared light.

2. Brief Description of the Prior Art

Most infrared (IR) sensors operating in the 8 to 12 μm wavelength region use optical windows as a protective measure, most such windows being made from n-doped polycrystalline germanium. Since the optical refractive index of germanium is high, the reflectance from each surface is high and the net transmittance through the germanium is relatively low. The refractive index of germanium is 4.0, resulting in 36% reflectance per surface. The transmittance of uncoated germanium is only 47% through a 0.040 inch thick piece. In order to improve the IR transmittance of the window, a suitable antireflection coating is generally provided whereby the window reflectance is reduced to an average value of 0.5% or less, thereby raising the transmittance to an average value of 95% or more over the 8 to 12 μm wavelength interval.

A further reason for reducing the reflectance per surface on an IR window is less apparent but equally important. Whenever a lens or window surface is nearly perpendicular to the optical axis, the cryogenically cooled IR detector can see a warm image of itself reflected from this lens or surface. A fraction of 1% reflectance from a surface about 200° C. warmer than the detector can cause a spurious "noise" which blinds the system to the scene beyond the reflecting surface. This effect is called "cold spike" or "narcissism" in IR systems and can also occur on lenses, regardless of prudent lens design technologies which minimize the problem by changing air spacings and/or the radii of curvature of the lenses. The window is in front of the detector in collimated space, so there are fewer opportunities to minimize "cold spike". The worst case occurs when the system optics are mounted on gimbals and look through a multi-pane window system. There are numerous gimbal orientations where the instantaneous optical axis is sufficiently perpendicular to one of the panes to cause such reflection. It is therefore important that each IR window surface have reflectance less than 1%.

The design of multilayer coatings for optical windows and lenses begins with the work of John Strong, "On a Method of Decreasing the Reflection From Nonmetallic Substances", *Journal of the Optical Society of America*, Vol. 26, page 73 (1936), Cox et al. "Infrared Filters of Anti-reflected Si, Ge, InAs and InSb", *Journal of the Optical Society of America*, Vol 51, page 1406 (1961) and progressing to Lubezky et al., "Efficient and Durable AR Coatings for Ge in the 8–11.5 μm Band Using Synthesized Refractive Indices of Evaporation of Homogeneous Mixtures", *Applied Optics*, Vol. 22, page 1828 (June, 1983). The recurring theme, backed by rigorous theory, is that the outermost layer of a truly efficient antireflection coating must have a very low refractive index. This layer is typically 2.0 μm thick when used for 8 to 12 μm applications. It must be physically hard, insoluble in water and survive in harsh environments such as salt spray and cycles of high to low temperature in a humid atmosphere. The summary article of Aguilera et al., "Antireflection Coatings for Germanium IR Optics: A Comparison of Numerical Design Methods", *Applied Optics*, Vol. 27, page 2832 (July, 1988) shows the extreme complexity required to even calculate an efficient design when a low index of refraction is not available. These complex designs are very sensitive to manufacturing errors and have very low yield.

The low index of refraction material of choice for most manufacturers has been thorium fluoride, $ThF_4$. In bulk form, fluorides tend to be insoluble and have a longwave cutoff in the 6 to 12 μm range. Fluorides tend to form evaporated films with high tensile stress, causing numerous problems such as cracking, peeling, and failure in harsh environmental tests. $ThF_4$ has low solubility, forms stable films 2.0 μm thick, has low absorptance in the 8 to 12 μm band and adheres to most other films. Mild radioactivity is its only flaw. Accordingly, use of $ThF_4$ requires an AEC license and strict adherence to the safety codes of Federal and State agencies.

Thorium fluoride has been used for at least 50 years in various optical applications, perhaps starting with Dimmick Patent No. 2,422,954. Dimmick uses thorium fluoride along with zinc sulfide films for visible optical purposes. The material is useful in ultraviolet (UV) filters also. The principal use of thorium fluoride has been for 8 to 12 μm IR antireflection coatings. Thorium fluoride has been employed in exterior window surface coatings which must have average reflectance as low as 0.5% per surface. Other methods, such as the use of diamond-like carbon as shown by Holland Patent No. 4,382,100, produce extremely durable films but have 3% average reflectance per surface. In many systems, this reflectance value is unacceptably high on the exterior window surface. In addition, the carbon films absorb 3% in this wavelength band. The net loss caused by reflectance and absorptance is 5%. This is unacceptably high in some systems.

Continued use of thorium fluoride now presents a problem due to its radioactivity and new requirements for disposal of radioactive materials. It is therefore necessary to find other materials to substitute for thorium fluoride which can provide the same properties.

The interior surface of the window is reasonably well protected. There are more coating design options for this surface since less durability is required. Materials other than thorium fluoride, such as barium fluoride or strontium fluoride, will suffice under these conditions, and can be incorporated into coating designs producing 0.5% average reflectance.

Magnesium fluoride, $MgF_2$, has been widely used as a durable single layer coating for visible glass optics since 1938, after the work of Cartwright and Turner Patent No. 2,207,656. It is also the low index material in nearly every visible glass multilayer coating, as shown by Thelen Patent No. 3,185,020 or Sulzbach Patent No. 3,565,509. As used for visible applications, the film is 0.1 μm thick, and has very high tensile stress.

When the conventionally evaporated $MgF_2$ film is made thicker than 0.3 μm, the high tensile stress has caused cracking. This material has seldom been used for IR applications beyond the 1 to 3 μm range. It is used as a bulk material in the 2 to 6 μm range. A 1 cm thick piece transmits 88% at 6 μm but less than 1% at 9 μm. The transmittance (T)

of 1 cm pieces of other materials referenced are listed in the following table:

| Material | %T @ 8 um | %T @ 12 um |
|---|---|---|
| $MgF_2$ | 15 | 0 |
| $CaF_2$ | 85 | 0 |
| $SrF_2$ | 92 | 6 |
| $PbF_2$ | 90 | 30 |
| $BaF_2$ | 93 | 40 |

Materials which transmit well at 12 μm and have a low index of refraction are very soft, very soluble or both. NaCl (common table salt) or KBr are such materials. Based upon transmittance data and physical thickness limits caused by tensile stress, $MgF_2$ is not an obvious choice as a coating material for use in the 8 to 12 μm interval.

Gibson, "Ion Beam Processing of Optical Thin Films", *Physics of Thin Films*, Vol. 13, page 139, Academic Press (1987), cites unpublished work indicating that 1.6 μm thick crack-free films of $MgF_2$ were possible using Ion Aided Deposition (IAD). Gibson further states that the limit of transparency of $MgF_2$ extends only to 6.5 μm, probably referring to published bulk data. Accordingly, the prior art has taught away from the use of $MgF_2$ as an external coating for an optical window operating in the 8 to 12 μm range.

SUMMARY OF THE INVENTION

In accordance with the present invention, there is provided a procedure and structure whereby $MgF_2$ is made to operate as a substitute for $ThF_4$ and provide the desirable properties thereof which are unexpected in view of the prior art.

$MgF_2$ is used as a primary external coating material for optical windows as well as other optical devices operating in the 8 to 12 μm wavelength range. Low energy ion aided deposition (IAD) is utilized as an enabling technology permitting the $MgF_2$ films to be made sufficiently thick to perform this task. Also, germanium (Ge) nucleation layers are provided on ion-cleaned germanium substrates. In addition, $Ta_2O_5$, optionally used as an adhesion promoting layer between ZnS and $MgF_2$, is novel. The basic design philosophy will work on other substrate group II–VI and group III–V materials such as, for example, ZnS, ZnSe, and GaAs. The latter requires care in pre-cleaning to not upset the Ga/As ratio at the top surface of the substrate. ZnS and ZnSe substrates will not benefit optically from the use of Ge nucleation layers. On these materials, ZnS is the first material deposited.

Germanium and zinc sulfide are commonly used IR coating materials. Tantalum pentoxide is particularly well suited for the purpose of promoting adhesion and is insoluble in acids and bases. All oxides absorb strongly in the 8 to 12 μm range, but if the layers are very thin, there is negligible transmittance loss. Such thin layers have been used for many years.

The process comprises the following major steps:

1) Pumpdown to a pressure less than $6\times10^{-6}$ Torr, while heating to from about 60° C. to about 300° C. and preferably about 160° C.

2) Ion beam cleaning with a Kaufman-type ion beam gun with 100 to 2000 eV, preferably 700 eV inert gas ions, preferably argon ions, to remove about 40 nm to about 120 nm and preferably 80 nm of damaged material. The chamber pressure increases to from about $5\times10^{-5}$ to about $2\times10^{-4}$ Torr and preferably about $9\times10^{-5}$ Torr during this step. The pressure depends upon the size of the emitting grid assembly, the chamber volume and the speed of the vacuum pumps. This step drives off loosely bound hydroxyl radicals and peens away substrate material which has been damaged chemically or mechanically during the grinding, polishing or diamond-point turning operation used to make the window surface.

3) Deposit a germanium nucleation layer, preferably by thermal or electron beam evaporation, with sufficient thickness to cover the microscopic hills and valleys in the ion beam cleaned surface, generally at least 150 nm thick and preferably 422 nm thick.

4) Deposit a ZnS layer from about 235 to about 255 nm thick and preferably about 244 nm thick, preferably by thermal or electron beam evaporation.

5) Deposit a Ge layer from about 145 to about 155 nm thick and preferably about 150 nm thick, preferably by electron beam evaporation.

6) Deposit a ZnS layer from about 515 to about 550 nm thick and preferably about 531 nm thick, preferably by thermal or electron beam evaporation.

7) Deposit a $Ta_2O_5$ layer about 15 nm thick, preferably by electron beam evaporation.

8) Deposit a $MgF_2$ layer from about 430 to about 460 nm and preferably 444 nm thick, preferably by thermal or electron beam evaporation while bombarding with 70 eV inert ions, preferably argon ions. The chamber pressure increases to about $9\times10^{-5}$ Torr during this step.

9) Deposit a $Ta_2O_5$ layer about 15 nm thick, preferably by electron beam evaporation.

10) Deposit a ZnS layer from about 350 to about 375 nm and preferably 361 nm thick, preferably by thermal or electron beam evaporation at a temperature of from about 250 to about 350 ° C. and preferably about 300° C. to improve the abrasion resistance of the entire coating. Deposition below 250 ° C. results in failure. The temperature limit of the chamber used was 350 ° C.

11) Raise temperature to about 300° C.

12) Deposit a $Ta_2O_5$ layer 15 nm thick, preferably by electron beam evaporation.

13) Deposit a $MgF_2$ layer of from about 95 to about 105 and preferably about 100 nm thick, preferably by thermal or electron beam evaporation, while bombarding with 70 eV inert gas ions, preferably argon ions. The chamber pressure increases to about $9\times10^{-5}$ Torr during this step.

14) The heaters are turned off, the chamber is allowed to cool for about 30 minutes and the chamber is vented with dry air or nitrogen.

The ZnS layer between the two tensile stessed $MgF_2$ layers is compressively stressed to minimize the effect of tensile stress and produce near zero net stress.

Ion beam cleaning can be accomplished at ion energies in the 100 eV to 2000 eV range. 700 eV was chosen because it is a good compromise considering process time, potential damage to substrate and frequency of maintenance of the ion beam gun. 80 nm of material is removed to assure removal of at least 40 nm of surface damage. Removal of more than 120 nm may cause unwanted roughening by preferential etching of the polycrystalline germanium.

Ion aided deposition occurs using ion energies in the range 1 eV to 200 eV, depending upon many variables and upon the coating materials. The materials used here respond well to 70 eV ions. Kaufman-type ion guns operate satisfactorily at 70 eV, however this is a practical lower limit.

Extensive environmental testing with many coating runs shows that step 7 above ($Ta_2O_5$ layer) was required to assure field lifespan similar to that of the coating design containing $ThF_4$ material currently in use. Step 7 was not needed to comply with the minimal environmental test requirements and is therefore optional. This indicates that the $MgF_2$ material itself is more durable than $ThF_4$.

DESCRIPTION OF THE PREFERRED EMBODIMENT

Figure 1:
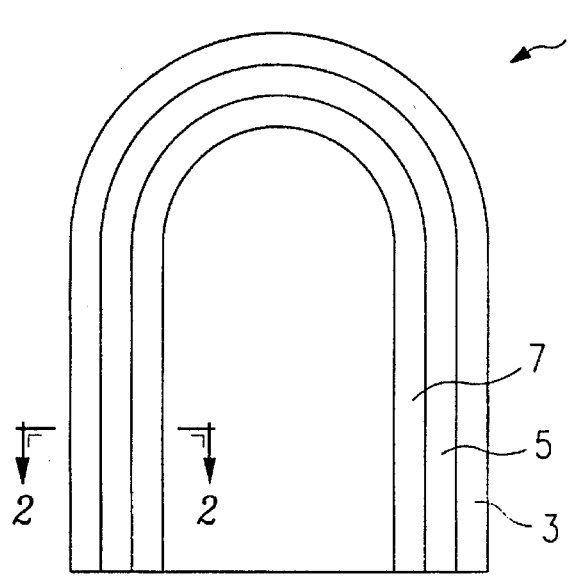
FIG. 1 is a cross sectional view of an optical window in accordance with the present invention.

A standard polycrystalline germanium window 1 was provided and placed in a reaction chamber having a layer of germanium 5 over the window and a multi-layer region 3 thereover as will be explained hereinbelow as shown in FIG. 1.

Figure 2:
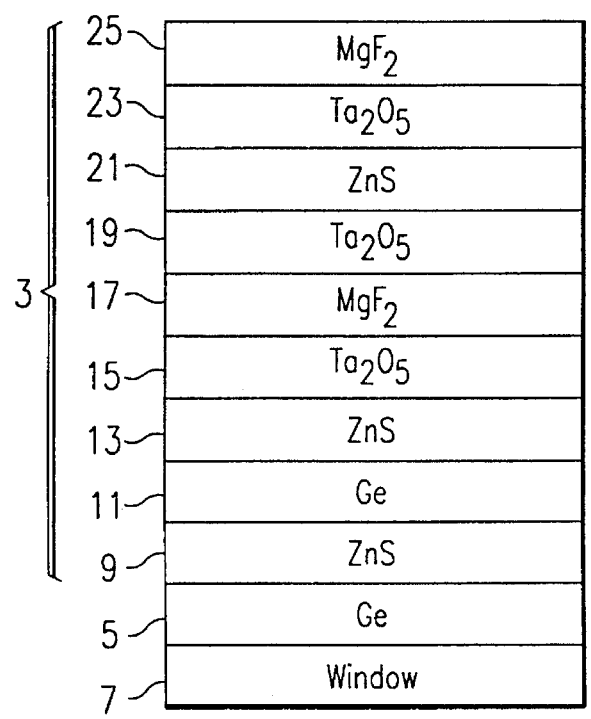
FIG. 2 is a cross sectional view along the line 2—2 of FIG. 1.

The process comprises the following major steps as shown in FIG. 2:

1) The pressure in the reaction chamber was pumped down to less than $6 \times 10^{-6}$ Torr, while heating the window to 160° C.

2) The outer surface of the window 7 was cleaned by ion beam cleaning with 700 eV argon ions to remove 80 nm of damaged material. The chamber pressure increased to about $9 \times 10^{-5}$ Torr during this step.

3) A germanium nucleation layer 3 422 nm thick was deposited on the cleaned surface of the window.

4) A first ZnS layer 9 244 nm thick was deposited over the germanium nucleation layer.

5) A germanium layer 11 217 nm thick was deposited over the ZnS layer.

6) A second ZnS layer 13 531 nm thick was deposited over the germanium layer.

7) A $Ta_2O_5$ layer 15 15 nm thick was deposited over the second ZnS layer.

8) A first $MgF_2$ layer 17 444 nm thick was deposited over the $Ta_2O_5$ layer while bombarding with 70 eV argon ions. The chamber pressure increased to about $9 \times 10^{-5}$ torr during this step.

9) A second $Ta_2O_5$ layer 19 15 nm thick was deposited over the first $MgF_2$ layer.

10) A third ZnS layer 21 361 nm thick was deposited over the second $Ta_2O_5$ layer.

11) The temperature in the chamber was raised to 300° C.

12) A third $Ta_2O_5$ layer 23 15 nm thick was deposited over the third ZnS layer.

13) A second $MgF_2$ layer 100 nm thick was deposited over the third $Ta_2O_5$ layer while bombarding with 70 eV argon ions. The chamber pressure increased to about $9 \times 10^{-5}$ Torr during this step.

14) The chamber temperature therein was allowed to drop to ambient temperature and the chamber was then purged with nitrogen.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. An optical device comprising:

(a) an ion beam cleaned substrate from which from about 40 nm to about 120 nm of material have been removed from the surface thereof to drive off loosely bound hydroxyl radicals and peen away substrate material which has been damaged chemically or mechanically during an operation used to make the window surface to provide a substantially damage-free surface; and (b) an ion deposition aided magnesium fluoride containing layer on said substantially damage-free surface transparent to solar energy in the range of 8 to 12 micrometer wavelength to reduce the reflectance of said substrate.

2. The device of claim 1 wherein said substrate is a lens.

3. The device of claim 2 wherein said ion deposition aided layer consists essentially of magnesium fluoride.

4. The device of claim 2 further including a layer of ZnS disposed between said substrate and said layer of magnesium fluoride.

5. The device of claim 4 wherein said ion deposition aided layer consists essentially of magnesium fluoride.

6. The device of claim 5 further including a layer of tantalum pentoxide disposed between said zinc sulfide and said magnesium fluoride to promote adhesion between said zinc sulfide and said magnesium fluoride.

7. The device of claim 1 wherein said substrate is an optical window.

8. The device of claim 7 wherein said window is composed of polycrystalline germanium.

9. The device of claim 8 further including a layer of ZnS disposed between said substrate and said layer of magnesium fluoride.

10. The device of claim 9 wherein said ion deposition aided layer consists essentially of magnesium fluoride.

11. The device of claim 10 further including a layer of tantalum pentoxide disposed between said zinc sulfide and said magnesium fluoride to promote adhesion between said zinc sulfide and said magnesium fluoride.

12. The device of claim 8 wherein said ion deposition aided layer consists essentially of magnesium fluoride.

13. The device of claim 7 further including a layer of ZnS disposed between said substrate and said layer of magnesium fluoride.

14. The device of claim 13 wherein said ion deposition aided layer consists essentially of magnesium fluoride.

15. The device of claim 14 further including a layer of tantalum pentoxide disposed between said zinc sulfide and said magnesium fluoride to promote adhesion between said zinc sulfide and said magnesium fluoride.

16. The device of claim 7 wherein said ion deposition aided layer consists essentially of magnesium fluoride.

17. The device of claim 1 further including a layer of ZnS disposed between said substrate and said layer of magnesium fluoride.

18. The device of claim 17 wherein said ion deposition aided layer consists essentially of magnesium fluoride.

19. The device of claim 18 further including a layer of tantalum pentoxide disposed between said zinc sulfide and said magnesium fluoride to promote adhesion between said zinc sulfide and said magnesium fluoride.

20. The device of claim 1 wherein said ion deposition aided layer consists essentially of magnesium fluoride.

21. An externally coated optical window which comprises:
 (a) an optical window from which from about 40 nm to about 120 nm of material have been removed from the surface thereof to drive off loosely bound hydroxyl radicals and peen away substrate material which has been damaged chemically or mechanically during an operation used to make the window surface a substantially damage-free surface; and
 (b) ion deposition aided magnesium fluoride externally coated on said substantially damage-free optical window, said magnesium fluoride being transparent to solar energy in the range of 8 to 12 micrometers.

* * * * *